United States Patent [19]

Margerum

[11] Patent Number: 4,477,773
[45] Date of Patent: Oct. 16, 1984

[54] FREQUENCY MEASURING APPARATUS

[75] Inventor: Donald L. Margerum, Santa Barbara, Calif.

[73] Assignee: Raytheon Company, Lexington, Mass.

[21] Appl. No.: 404,113

[22] Filed: Aug. 2, 1982

[51] Int. Cl.³ ............................................ G01R 23/14
[52] U.S. Cl. .................................... 324/79 R; 328/134
[58] Field of Search ................. 324/78 R, 78 D, 78 Z, 324/79 R, 79 D, 83 R, 83 A, 83 D, 82; 328/133, 134, 155

[56] References Cited

U.S. PATENT DOCUMENTS 3,012,200 12/1961 Hurvitz ................................. 328/134
4,144,491 3/1979 Hutcheon ............................... 324/82

*Primary Examiner*—Michael J. Tokar
*Attorney, Agent, or Firm*—Richard M. Sharkansky; Joseph D. Pannone

[57] ABSTRACT

A frequency measuring apparatus is provided wherein an input signal is separated into a pair of channels. A phase modulating circuit modulates the phase of the portion of the input signal fed to a first one of the pair of channels as a function of time in response to a phase modulating signal to provide a corresponding phase modulated signal. A power divider in the second one of the pair of channels separates the portion of the input signal fed to the second one of the pair of channels into a plurality of signals having phase delays imparted thereto which are proportional to the frequency of the input signal. The phase modulated signal is combined with each one of the phase delayed signals to produce a plurality of modulated signals, each one thereof having, as the envelope thereof, a signal having a frequency related to the frequency of the phase modulating signal and a phase angle relative to the phase of the phase modulating signal which is related to the frequency of the input signal. The components of the envelopes of the modulated signals are detected and are fed, along with the phase modulating signal, to a phase detecting means for determining the phase differences between the envelope components relative to the phase of the phase modulating signal and, from such phase differences, the frequency of the input signal.

4 Claims, 1 Drawing Figure

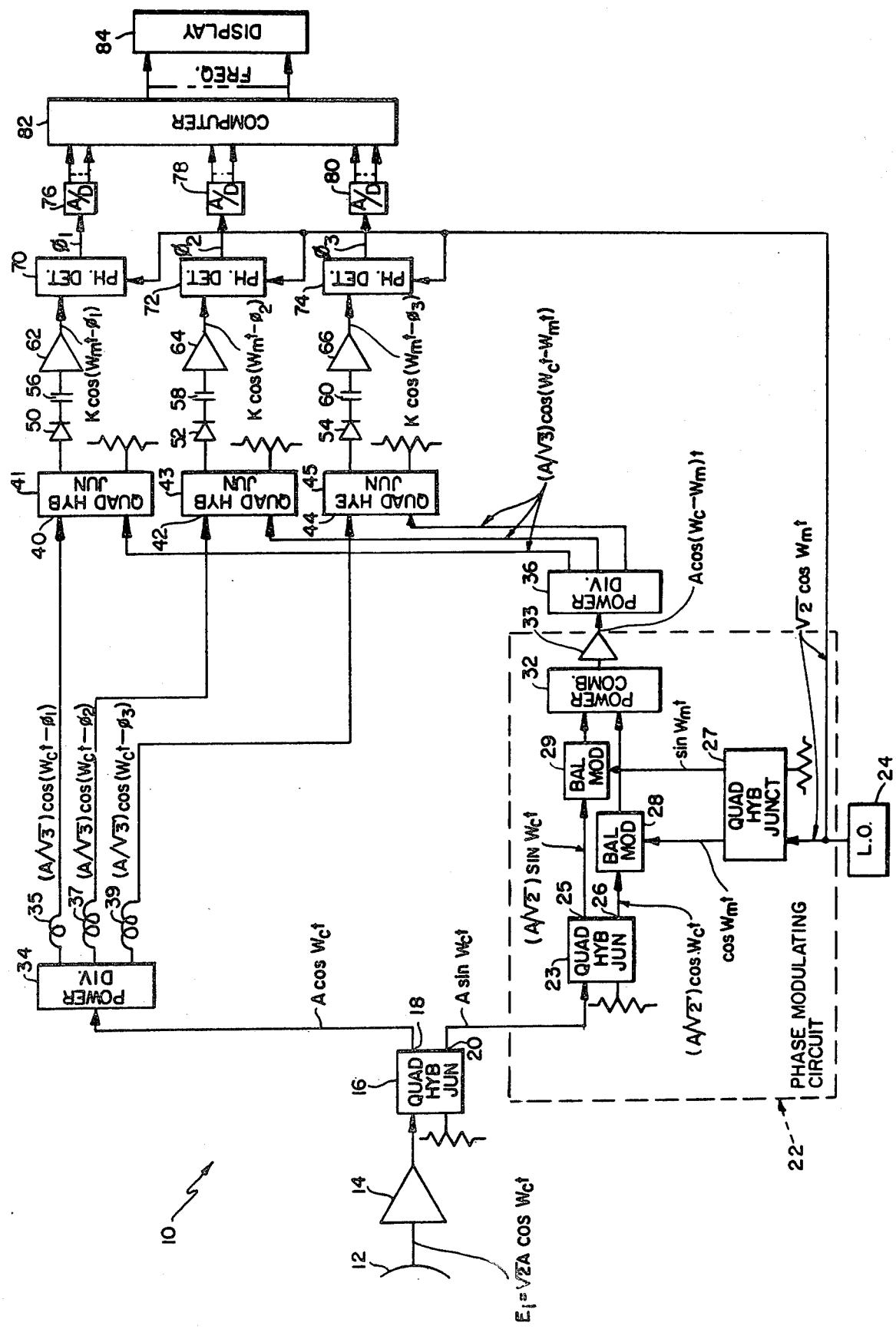

FREQUENCY MEASURING APPARATUS

BACKGROUND OF THE INVENTION

This invention relates generally to frequency measuring apparatus and more particularly to instantaneous frequency measurement (IFM) devices which are adapted for use in measuring the frequency of radio frequency signals.

As is known in the art, instantaneous frequency measurement (IFM) devices are used in a variety of applications, as where it is desired to measure the frequency of individual pulsed or continuous wave (cw) radio frequency signals. One type of IFM device includes a wide bandwidth radio frequency limiter circuit fed by the radio frequency input signals where the IFM device is to operate over a dynamic range of 50 db or greater. The limited radio frequency signals are then fed to at least one delay line discriminator to provide an unambiguous measurement of the frequency of the input signals. Each delay line discriminator generally includes a power divide for separating the limited radio frequency signals into two quadrature channels, the signal in one channel being delayed in phase with respect to the other channel, such phase delay being related to the frequency of the input signals. The outputs of the two quadrature channels are combined and detected to form two baseband frequency output signals which have amplitudes which are proportional to the sine and cosine of the phase difference between the signals at the outputs of the quadrature channels and hence related to the frequency of the input signals. Thus, to determine the sine and cosine functions, conventional sine/cosine microwave discriminators are used together with radio frequency limiters and gray-level encoders. While such techniques may be useful in some applications, the use of RF limiters are relatively expensive and the encoders are limited in dynamic range.

SUMMARY OF THE INVENTION

In accordance with the present invention, a frequency measuring apparatus is provided wherein an input signal is separated into a pair of channels. A phase modulating circuit modulates the phase of the portion of the input signal fed to a first one of the pair of channels as a function of time in response to a phase modulating signal to provide a corresponding phase modulated signal. A power divider in the second one of the pair of channels separates the portion of the input signal fed to the second one of the pair of channels into a plurality of signals having phase delays imparted thereto which are proportional to the frequency of the input signal. The phase modulated signal is combined with each one of the phase delayed signals to produce a plurality of modulated signals, each one thereof having, as the envelope thereof, a signal having a frequency related to the frequency of the phase modulating signal and a phase angle relative to the phase of the phase modulating signal which is related to the frequency of the input signal. The envelopes of the modulated signals are detected and are fed, along with the phase modulating signal, to a phase detecting means for determining the phase differences between the envelope relative to the phase of the phase modulating signal and, from such phase differences, the frequency of the input signal.

BRIEF DESCRIPTION OF THE DRAWING

The foregoing features of the invention as well as the invention itself may be more fully understood from the following detailed description read together with the accompanying drawing, the single FIGURE of which is a block diagram of an instantaneous frequency measuring apparatus according to the invention.

DESCRIPTION OF THE PREFERRED EMBODIMENT

Referring now to the FIGURE, an instantaneous frequency measuring apparatus 10 is shown adapted for use in determining the frequency of a received radio frequency signal. Thus, apparatus 10 includes a conventional radio frequency receiving antenna 12, the output of which is fed to a conventional radio frequency amplifier 14 having a predetermined bandwidth, here a bandwidth of 1.6 GHz to 6.72 GHz, where the received radio frequency signal is amplified by such amplifier 14. The amplified radio frequency signal is fed to a quadrature hybrid junction 16, as shown. The in-phase output port 18 and the out of phase output port 20 of such quadrature hybrid junction 16 provide a pair of quadrature signal channels. More particularly, output port 20 is fed to a phase modulating circuit 22. Also fed to the phase modulating circuit 22 is a phase modulating signal produced by a local oscillator 24. The phase modulating signal may be represented as $\sqrt{2} \cos w_m t$, where $w_m$ is here $2\pi(20 \times 10^6)$ radians per second. If the received signal is represented as $\sqrt{2} A \cos w_c t$, the signal produced at output port 20 of hybrid 16 may be represented as $A \sin w_c t$. The phase modulating circuit 22, here a single side band generator, includes a quadrature hybrid coupler 23 fed by the signal produced at port 20 of hybrid coupler 16 and produces at output port 25 an in-phase component of the signal fed thereto and at output port 26 an out of phase component of such signal. Thus, the signals produced at output ports 25, 26 may be represented as: $(A/\sqrt{2}) \sin w_c t$ and $(A/\sqrt{2}) \cos w_c t$, respectively. The modulating signal produced by local oscillator 24 is separated into an in-phase component and out of phase component by quadrature hybrid junction 27; the in-phase component, $\cos w_m t$ being fed to a balanced modulator 28 along with the signal produced at output port 26 of hybrid coupler 23 and the out of phase component, $\sin w_m t$, being fed to a balanced modulator 29 along with the signal produced at output port 25 of hybrid junction 23. The outputs of the modulators 28 and 29 are combined in a power combiner 32 which produces an output signal $(1/K)(2A\sqrt{2})\cos(-W_c - W_m)t$, where K is the conversion loss of the modulating circuit. This signal is amplified by amplifier 33 with an amplification of $(K\sqrt{2}/2)$ so that the signal into the power divider 36 is $A \cos (W_c - W_m)t$. Thus, the phase modulating circuit 22 provides a time varying modulation to the phase of the input signal. To put it another way, the phase of the signal produced at output port 20 is modulated as a function of time and such time varying phase component $\phi(t)$ may be represented as $\phi(t) = w_m t$. The phase modulated signal produced by phase modulating circuit 22 is fed to a three-way power divider 36, as shown. Each one of the three outputs of the power divider 36 is fed to one of three quadrature hybrid junctions 41, 43 and 45, respectively, as shown.

Returning now to the upper in-phase channel, it is noted that the signal produced at output port 18 may be represented as $A \cos w_c t$. This signal is fed to a conventional 3:1 power divider 34, as shown. The three outputs of the 3:1 power divider 34 are fed to delay lines 35, 37 and 39, respectively, as indicated. The delay lines 35, 37 and 39 are of any conventional design and here are chosen to have electrical lengths $L_1$, $L_2$ and $L_3$ so that the signals arriving at the detectors 50, 52 and 54 through the upper ports 40, 42 and 44 of the quadrant hybrid junctions 41, 43 and 45 are delayed with respect to the signals arriving at the same detectors 50, 52 and 54 through the lower ports of the quadrant hybrid junctions 41, 43 and 45 by 6.914 inches, 9.218 inches and 41.484 inches, respectively. Thus, the signals arriving at the detectors 50, 52 and 54 may be represented as:

$$(A/\sqrt{3})\cos(W_c t - \phi_1) + (A/\sqrt{3})\cos(W_c t - W_m t);$$

$$(A/\sqrt{3})\cos(W_c t - \phi_2) + (A/\sqrt{3})\cos(W_c t - W_m t); \text{ and}$$

$$(A/\sqrt{3})\cos(W_c t - \phi_3) + (A/\sqrt{3})\cos(W_c t - W_m t);$$

respectively, where: $\phi_1 = 360(L_1/\lambda) = 210.89 f_c$ degrees $\phi_2 = 360(L_2/\lambda) = 281.17 f_c$ degrees $\phi_3 = 360(L_3/\lambda) = 1265.3 f_c$ degrees $(f_c = W_c/2\pi \times 10^9 \text{ GHz}, \lambda = 11.802/f_c \text{ inches})$ These signals arriving at the detectors 50, 52 and 54 may be rewritten, using well known trigonometric identities as:

$$(A/\sqrt{3})[2\cos\tfrac{1}{2}(2W_c t - \phi_1 - W_m t) \cdot \cos\tfrac{1}{2}(-\phi_1 + W_m t)];$$

$$(A/\sqrt{3})[2\cos\tfrac{1}{2}(2W_c t - \phi_2 - W_m t) \cdot \cos\tfrac{1}{2}(-\phi_2 + W_m t)]; \text{ and}$$

$$(A/\sqrt{3})[2\cos\tfrac{1}{2}(2W_c t - \phi_3 - W_m t) \cdot \cos\tfrac{1}{2}(-\phi_3 + W_m t)];$$

respectively.

The detectors 50, 52 and 54 are square law detectors which detect the modulation envelope of these signals which is slowly varying at $W_m t$. Therefore, the outputs of the detectors 50, 52 and 54 are:

$$(A^2/3)\cos^2[\tfrac{1}{2}(W_m t - \phi_1)] = A^2/6 [1 + \cos(W_m t - \phi_1)]$$

$$(A^2/3)\cos^2[\tfrac{1}{2}(W_m t - \phi_2)] = A^2/6 [1 + \cos(W_m t - \phi_2)]$$

$$(A^2/3)\cos^2[\tfrac{1}{2}(W_m t - \phi_3)] = A^2/6 [1 + \cos(W_m t - \phi_3)]$$

After passing through the capacitors 56, 58 and 60, only the AC component of these signals appear at the video limiting amplifiers 62, 64 and 66. The signals at the outputs of these limiting amplifiers may be represented as:

$$K\cos(W_m t - \phi_1)$$

$$K\cos(W_m t - \phi_2)$$

$$K\cos(W_m t - \phi_3)$$

The signals produced by limiters 62, 64, 66 are fed to phase detectors 70, 72, 74, respectively. The signal produced by local oscillator 24 is also fed to phase detectors 70, 72, 74, as indicated. Phase detectors 70, 72, 74 thus produce voltages representative of the phase angles $\phi_1$, $\phi_2$ and $\phi_3$, respectively. These voltages are fed to analog-to-digital (A/D) converters 76, 78 and 80, respectively, as indicated, to produce digital words, representative of the phase angles $\phi_1$, $\phi_2$ and $\phi_3$, respectively. The digital words representative of $\phi_1$, $\phi_2$ and $\phi_3$ are fed to a digital computer 82 of any conventional design to calculate, in a manner to be described, the frequency of the received signal in accordance with the three determined phase angles $\phi_1$, $\phi_2$ and $\phi_3$. Digital computer 82 is programmed in any conventional manner to compute the frequency $f_c$ of the received radio frequency signal. The encoded phase angles $\phi_1$, $\phi_2$ and $\phi_3$ are biased by adding constants as follows:

$$\phi_1' = (\phi_1 + 202.70) \text{ degrees}$$

$$\phi_2' = (\phi_2 + 270.33) \text{ degrees}$$

$$\phi_3' = (\phi_3 - 224.00) \text{ degrees}$$

An integer $K_I$ is determined by calculating the nearest integer to $[\phi_2' - 1.333\phi_1']/120$; once the integer $K_I$ is determined, the values of $N_1$ and $N_2$ are determined from the following table:

| $K_I$ | 0 | −1 | +1 | −2 | +2 | −3 | +3 |
|---|---|---|---|---|---|---|---|
| $N_1$ | 3 | 2 | 4 | 4 | 2 | 3 | 3 |
| $N_2$ | 4 | 3 | 5 | 6 | 2 | 5 | 3 |

(In computer 82, such table may be implemented by a read only memory (ROM)). An intermediate value of $\overline{\phi_2'}$ is determined by computer 82 as follows:

$$\overline{\phi_2'} = (\tfrac{1}{2})[1.333(\phi_1' + 360 N_1) + (\phi_2' + 360 N_2)]$$

Thus, in the succeeding step, a coarse measurement of the frequency ($f_c$) of the input received signal is determined by computer 82 as follows:

$$f_c = (\overline{\phi_2'} - 270.33)/281.17$$

The calculated frequency $f_c$ is then here fed to a conventional display 84, as shown.

To determine the frequency $f_c$ of the received signal to a greater precision, an integer $N_3$ is determined by calculating the following nearest integer to:

$$N_3 = [(4.5 \overline{\phi_2'} - \phi_3')/360] - 4$$

The frequency of the received signal may be determined to greater precision by the following relationship:

$$f_c = [\phi_3' + 360 N_3 + 224]/1265.38.$$

Thus, it can be seen that a digital frequency measuring apparatus 10 is provided by impressing an amplitude modulation on the differently delayed radio frequency signals produced at the output of delay lines 35, 37 and 39, the phase of a component of the envelope of the amplitude modulated signals being proportional to the frequency of the received radio frequency signal. The envelopes of the amplitude modulated signals are detected and the phase angles thereof are measured with respect to the phase of the local oscillator signal, such measured phase angles being used to calculate the frequency of the received radio frequency signal.

Having described a preferred embodiment of the invention, it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. Apparatus for measuring the frequency of an input signal having a frequency, f, comprising:
    (a) means for feeding the input signal to a pair of separate signal channels;
    (b) means disposed in a first one of the separate signal channels and responsive to a phase modulating signal and the input signal for producing a phase modulated signal having a phase angle relative to the phase of the input signal which changes as a function of time;
    (c) means, disposed in a second one of the separate signal channels and fed by the input signal, for shifting the phase of the input signal an amount $\phi = Kf$ where K is a constant;
    (d) means for combining the phase modulated signal and the phase shifted signal to produce a composite signal having the input signal as a carrier signal, and as the envelope thereof, a signal having the frequency of the modulating signal and a phase angle, relative to the phase modulating signal, proportional to the phase shift $\phi$ provided by the phase shifting means;
    (e) phase detector means responsive to the composite signal and the phase modulating signal, for detecting the phase angle of the envelope of such composite signal relative to the phase of the phase modulating signal; and
    (f) computer means responsive to the detected phase angle for determining the frequency of the input signal.

2. The apparatus recited in claim 1 wherein the phase shifting means includes a delay line.

3. The apparatus recited in claim 1 wherein the phase changing means includes a single side band generator.

4. Apparatus for measuring the frequency, $f_c$, of an input signal comprising:
    (a) means for feeding the input signal to a pair of separate signal channels;
    (b) means disposed in a first one of the separate signal channels and responsive to a modulating signal having a frequency, $f_m$, for producing a modulated signal having a frequency $f_c$ shifted by the frequency $f_m$;
    (c) means disposed in a second one of the separate signal channels and responsive to the input signal fed to a second one of the pair of signal channels for shifting the phase of the input signal having the frequency $f_c$ an amount $\phi = Kf_c$ where K is a constant;
    (d) means for combining the modulated signal and the phase shifted signal to produce a composite signal having an envelope with frequency $f_m$ and the phase shift $\phi$;
    (e) phase detector means responsive to the composite signal and the modulating signal for determining the phase shift $\phi$ of the envelope of the composite signal; and
    (f) computer means responsive to the determined phase shift $\phi$ for determining the frequency f of the input signal.

* * * * *